United States Patent
Kim et al.

(10) Patent No.: US 12,417,814 B2
(45) Date of Patent: Sep. 16, 2025

(54) STORAGE DEVICE FOR BACKING UP STATE GROUP DATA IN THE EVENT OF A SUDDEN POWER-OFF AND PROGRAM METHOD THEREOF

(71) Applicant: Samsung Electronics Co., Ltd., Suwon-si (KR)

(72) Inventors: Hyeonwu Kim, Suwon-si (KR); Hojun Jo, Suwon-si (KR); Jihwan Mun, Suwon-si (KR); Yoonjin Lee, Suwon-si (KR); Jae Hun Jang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 131 days.

(21) Appl. No.: 18/186,480

(22) Filed: Mar. 20, 2023

(65) Prior Publication Data
US 2024/0120019 A1    Apr. 11, 2024

(30) Foreign Application Priority Data
Oct. 7, 2022 (KR) .......................... 10-2022-0128754

(51) Int. Cl.
*G11C 16/06* (2006.01)
*G11C 16/10* (2006.01)
*G11C 16/34* (2006.01)
*G11C 29/52* (2006.01)

(52) U.S. Cl.
CPC ............ *G11C 29/52* (2013.01); *G11C 16/102* (2013.01); *G11C 16/3459* (2013.01)

(58) Field of Classification Search
CPC ... G11C 29/52; G11C 16/102; G11C 16/3459; G11C 16/0483; G11C 11/5642; G11C 16/26; G11C 16/10; G11C 2029/0411; G11C 11/5628; G11C 16/30; G11C 5/143; G06F 11/1032; G06F 11/1048
USPC ..................................................... 365/185.09
See application file for complete search history.

(56) References Cited

U.S. PATENT DOCUMENTS

| | | | |
|---|---|---|---|
| 6,513,095 B1 | 1/2003 | Tomori | |
| 7,679,133 B2 | 3/2010 | Son et al. | |
| 8,391,062 B2* | 3/2013 | Jang ..................... | G11C 11/5628 365/185.2 |
| 8,553,466 B2 | 10/2013 | Han et al. | |
| 8,559,235 B2 | 10/2013 | Yoon et al. | |
| 8,654,587 B2 | 2/2014 | Yoon et al. | |
| 9,424,953 B2* | 8/2016 | Hirano ................. | G11C 29/702 |
| 9,921,898 B1 | 3/2018 | Miller et al. | |
| 10,289,487 B2* | 5/2019 | Yang ..................... | G06F 3/0688 |
| 10,824,523 B2 | 11/2020 | Jun et al. | |

(Continued)

FOREIGN PATENT DOCUMENTS

KR    10-2021-0065022 A    6/2021

*Primary Examiner* — Tha-O H Bui
(74) *Attorney, Agent, or Firm* — Harness, Dickey & Pierce, P.L.C.

(57) ABSTRACT

Example embodiments are directed to a method for programming a storage device including a nonvolatile memory device and a storage controller for storing multi-bit data, programming, by the storage controller, the multi-bit data into the nonvolatile memory device based on a pre-programming operation, reading state group data of the multi-bit data generated in the nonvolatile memory device based on a program result of the pre-programming operation, and performing, by the storage controller, error correction decoding on the state group data.

17 Claims, 15 Drawing Sheets

(56) References Cited

U.S. PATENT DOCUMENTS

| | | |
|---|---|---|
| 11,037,628 B2 | 6/2021 | Oh et al. |
| 2011/0233648 A1 | 9/2011 | Seol et al. |
| 2021/0158874 A1* | 5/2021 | Jang ...................... G06F 3/0619 |
| 2022/0121517 A1 | 4/2022 | Kim |
| 2022/0129180 A1 | 4/2022 | Kim et al. |

* cited by examiner

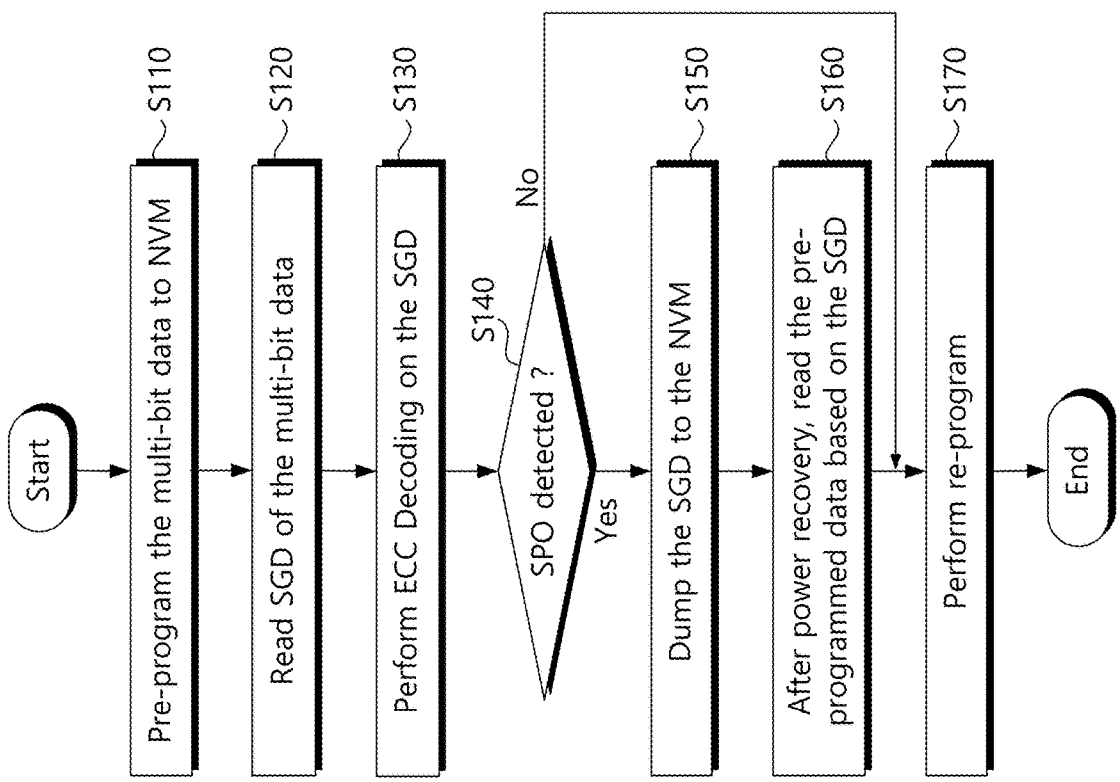

STORAGE DEVICE FOR BACKING UP STATE GROUP DATA IN THE EVENT OF A SUDDEN POWER-OFF AND PROGRAM METHOD THEREOF

CROSS-REFERENCE TO RELATED APPLICATIONS

This application claims priority under 35 U.S.C. § 119 to Korean Patent Application No. 10-2022-0128754 filed on Oct. 7, 2022, in the Korean Intellectual Property Office, the disclosures of which is incorporated by reference herein in its entirety.

BACKGROUND

Example embodiments of the present disclosure described herein relate to a semiconductor memory device, and more particularly, to a storage device and a programming method thereof.

A storage device is a device that stores data under the control of a host device such as a computer, smart phone, or smart pad. Storage devices include a hard disk drive (hereinafter referred to as HDD) using a magnetic disk as a storage medium, a solid state drive (hereinafter referred to as SSD) using a semiconductor memory as a storage medium, and a memory card.

Storage devices are mostly driven using an external power source. A storage device may be fatally damaged, such as data loss, due to an external power failure or power-off (hereinafter, including sudden power-off). Therefore, in order to solve this problem or challenge, an auxiliary power supply for backup is provided inside the storage device. However, there is a limitation in that limited energy provided from the auxiliary power supply is used for data backup of the storage device performed during sudden power-off SPO.

SUMMARY

Example embodiments of the present disclosure provide a storage device capable of efficiently backing up state group data in the event of a sudden power-off SPO occurring during programming of multi-bit data, and a program method thereof.

A method for programming a storage device including a nonvolatile memory device and a storage controller for storing multi-bit data, programming, by the storage controller, the multi-bit data into the nonvolatile memory device based on a pre-programming operation, reading state group data of the multi-bit data generated in the nonvolatile memory device based on a program result of the pre-programming operation, and performing, by the storage controller, error correction decoding on the state group data.

A storage devices, comprising, a nonvolatile memory device provided as a storage medium of the storage device, a buffer memory temporarily storing data input/output to the nonvolatile memory device, and a storage controller configured to perform a pre-program operation to program multi-bit data requested to be written into a first area of the nonvolatile memory device, and perform a re-program operation to program the multi-bit data into a second area of the nonvolatile memory device using the state group data generated through the pre-program operation, wherein the storage controller performs error correction decoding when reading the state group data.

A programming method of a storage device storing multi-bit data based on a pre-program operation and a re-program operation, programming the multi-bit data into a nonvolatile memory device based on the pre-program operation, reading state group data of the multi-bit data generated based on the pre-program operation, performing error correction decoding on the state group data, and backing up the state group data processed by the error correction decoding after processing an error correction encoding in the nonvolatile memory device, when sudden power-off is detected.

BRIEF DESCRIPTION OF THE FIGURES

The above and other objects and features of the present disclosure will become apparent by describing in detail some example embodiments thereof with reference to the accompanying drawings.

FIG. 12 is a flowchart illustrating a program method utilizing state group data SGD according to an example embodiment of the present invention.

DETAILED DESCRIPTION

It is to be understood that both the foregoing general description and the following detailed description are example, and it is to be considered that an additional description of the claimed invention is provided. Reference signs are indicated in detail in example embodiments of the present invention, examples of which are indicated in the reference drawings. Wherever possible, the same reference numbers are used in the description and drawings to refer to the same or like parts.

In the following, a storage device using a flash memory device will be used as an example to describe the features and functions of the present invention. However, those skilled in the art will readily appreciate other advantages and capabilities of the present invention in light of the teachings herein. The present invention may also be implemented or applied through other example embodiments. In addition, the detailed description may be modified or changed according to viewpoints and applications without significantly departing from the scope, spirit, and other objectives of the present invention.

Figure 1:
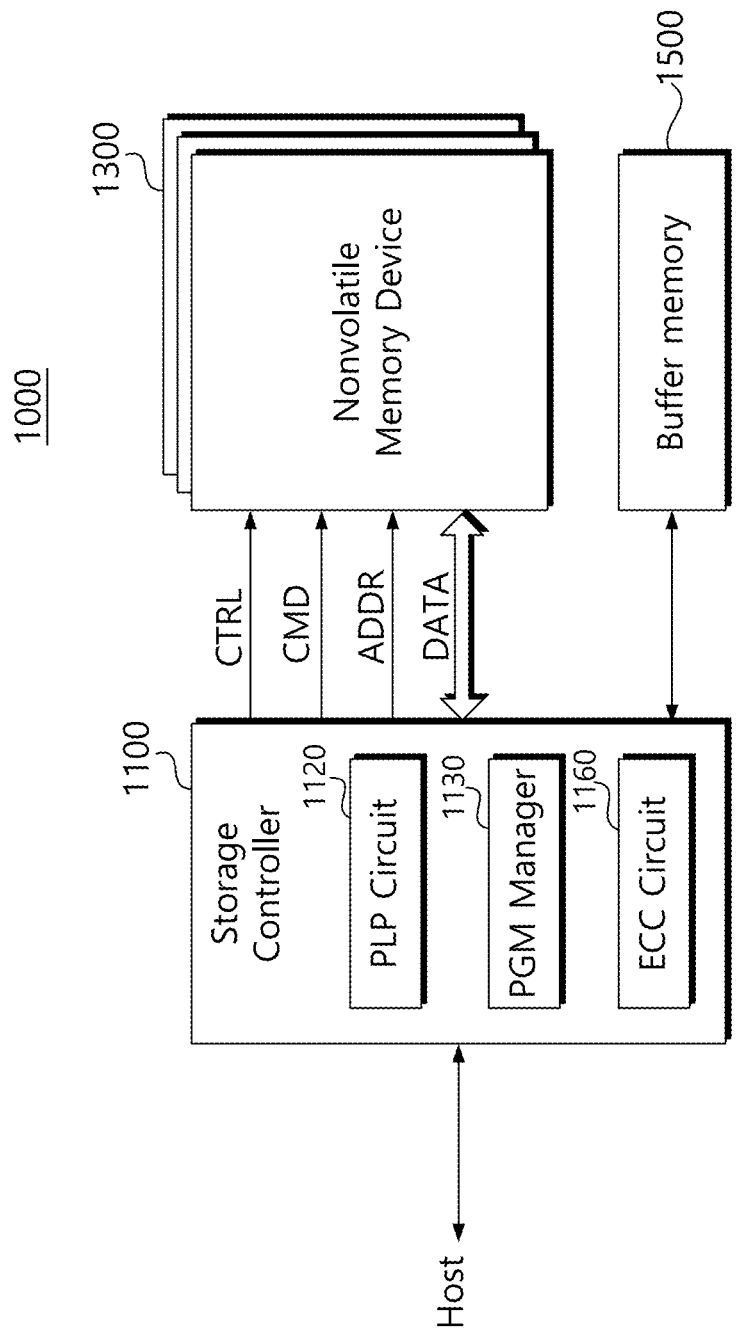
FIG. 1 is a block diagram illustrating a storage device according to an example embodiment of the present invention.

FIG. 1 is a block diagram illustrating a storage device according to an example embodiment of the present invention. Referring to FIG. 1, a storage device 1000 may include a storage controller 1100, a nonvolatile memory (NVM) device 1300, and a buffer memory 1500.

The storage controller 1100 may be configured to control the nonvolatile memory device 1300 and the buffer memory 1500 according to a command or control signal from a host. For example, the storage controller 1100 may write data into the nonvolatile memory device 1300 or read data stored in the nonvolatile memory device 1300 according to a request of the host. To access the nonvolatile memory device 1300, the storage controller 1100 provides a command CMD, an address ADDR, data DATA, and a control signal CTRL to the nonvolatile memory device 1300.

The storage controller 1100 may manage a program operation of multi-level cells included in the nonvolatile memory device 1300. The storage controller 1100 programs multi-bit data through pre-program and re-program processes. The storage controller 1100 programs multi-bit data in the pre-program area through pre-programming. At this time, State Group Data (hereinafter referred to as SGD) representing state information of the pre-programmed data is generated. State group data SGD is also referred to as digest data. Then, the storage controller 1100 reads the state group data SGD and pre-programmed data and performs re-programming.

In particular, when a power failure event such as sudden power-off SPO occurs during a program operation, the storage controller 1100 of the present invention may backup (or dump) state group data SGD to the nonvolatile memory device 1300 using limited auxiliary power. In this case, it is necessary to reduce the size of the state group data SGD for a backup operation using limited energy. The storage controller 1100 of the present invention may perform ECC decoding during a read operation of the state group data SGD. After ECC decoding, the ECC parity included in the state group data SGD may be removed. Then, when backing up the state group data SGD, parity generated by ECC encoding will be added. Accordingly, when the state group data SGD is backed up, capacity increase due to ECC parity can be prevented or reduced. If ECC parity is not removed through ECC decoding of the state group data SGD, data encoding the ECC parity will be added when the state group data SGD is backed up.

For a backup operation of state group data SGD according to some example embodiments of the present invention, the storage controller 1100 includes a power loss prevention PLP circuit 1120, a program (PGM) manager 1130, and an error correction code (hereinafter referred to as ECC) circuit 1160.

The PLP circuit 1120 monitors an external power supply and detects power events such as sudden power-off SPO. When a sudden power-off SPO occurs, the PLP circuit 1120 may generate a power off detection signal PO_DET and provide it to the program manager 1130. When the program manager 1130 receives the power-off detection signal PO_DET, it stops the operation currently being performed.

Also, the program manager 1130 may enter a backup operation mode and back up data stored in the buffer memory 1500 to the nonvolatile memory device 1300.

When a sudden power-off SPO occurs at a time point before re-programming after the pre-program operation is completed, the program manager 1130 back up the state group data SGD stored in the buffer memory 1500 to the nonvolatile memory device 1300. At this time, the state group data SGD to be backed up is backup data to which ECC decoding is applied during a read operation. And the ECC circuit 1160 will apply ECC encoding to the state group data SGD having only message data. Then, the program manager 1130 programs the state group data SGD having ECC parity into the nonvolatile memory device 1500. Accordingly, an increase in the size of parity data accompanying reading of the state group data SGD can be prevented or reduced.

The nonvolatile memory device 1300 may store data received from the storage controller 1100 or transmit stored data to the storage controller 1100. The nonvolatile memory device 1300 is provided as a storage medium of the storage device 1000. For example, the nonvolatile memory device 1300 may be provided as a NAND-type flash memory having a large storage capacity. The nonvolatile memory device 1300 may include a plurality of flash memory devices.

In general, a plurality of flash memory devices are connected to the storage controller 1100 in units of channels. A plurality of flash memory devices communicating through the same data bus are connected to one channel. The nonvolatile memory device 1300 may communicate with the storage controller 1100 in a channel/way interleaving method.

The buffer memory 1500 may be used as a data buffer for exchanging data between the storage device 1000 and the host. Write data provided from the host or data read from the nonvolatile memory device 1300 are temporarily stored in the buffer memory 1500. When data existing in the nonvolatile memory device 1300 is cached upon read request from the host, the buffer memory 1500 supports a cache function that directly provides the cached data to the host. The buffer memory 1500 may be provided as synchronous DRAM to provide sufficient buffering in the storage device 1000 used as a large-capacity secondary storage device. However, it is obvious to those who have acquired ordinary knowledge in this field that the buffer memory 1500 is not limited to the disclosure herein.

According to the above example embodiments, the storage device 1000 performs ECC decoding during the read operation of state group data SGD of pre-programmed multi-bit data. A parity part of the state group data SGD read by ECC decoding may be removed. Accordingly, size increase during backup of the state group data SGD can be minimized. This means that when a sudden power-off SPO event occurs, the backup speed of state group data SGD can be improved.

Figure 2:
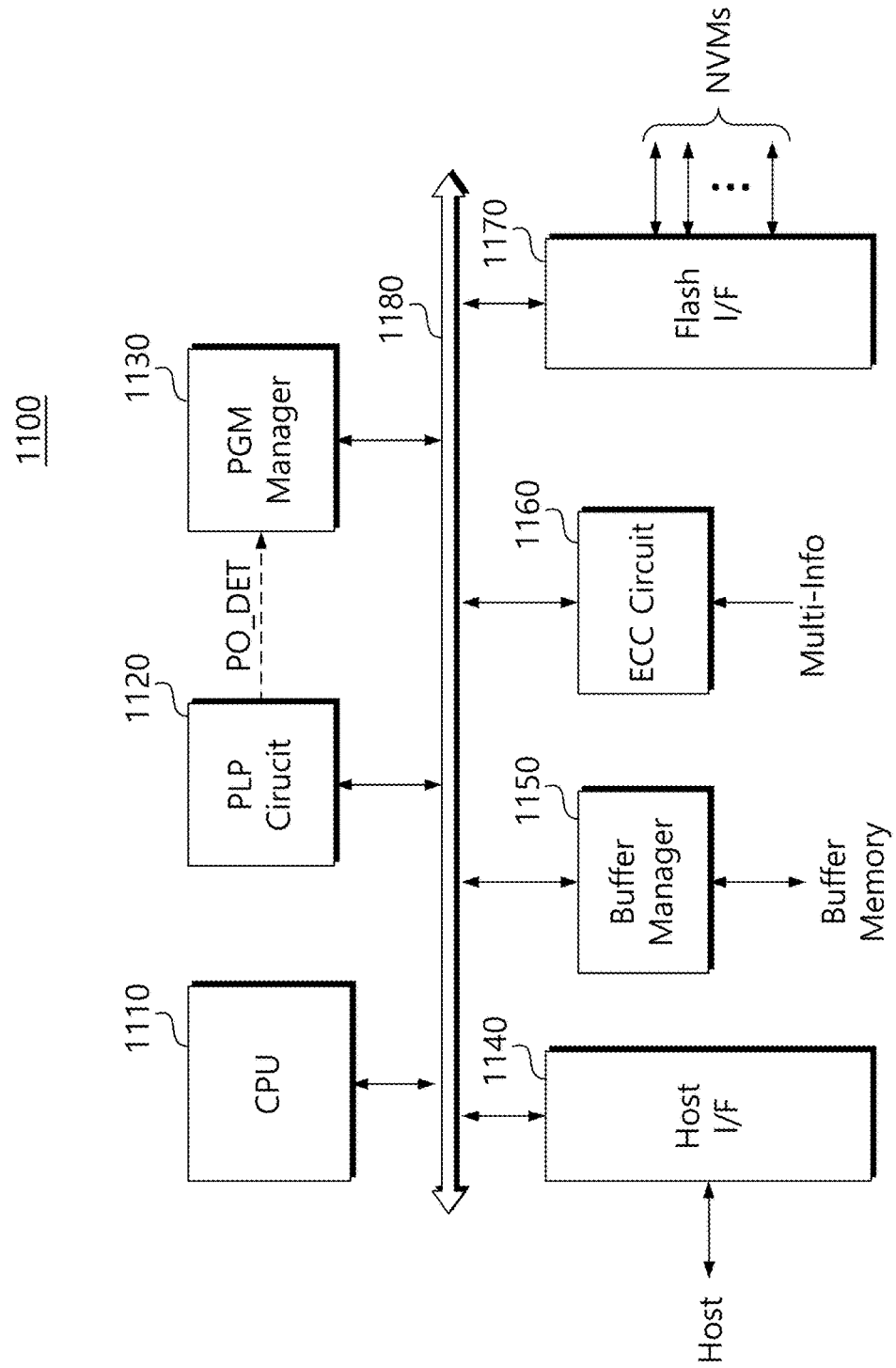
FIG. 2 is a block diagram showing the configuration of the storage controller of FIG. 1 as an example.

FIG. 2 is a block diagram showing the configuration of the storage controller of FIG. 1. Referring to FIG. 2, the storage controller 1100 of the present invention includes a central processing unit CPU 1110, a power loss prevention PLP circuit 1120, a program manager 1130, a host interface 1140, a buffer manager 1150, an error correction code (hereinafter referred to as ECC) circuit 1160, a flash interface 1170, and a system bus 1180.

The central processing unit 1110 may include a processing unit such as a micro-processor. The central processing unit 1110 supervises all operations of the storage controller 1100.

The central processing unit 1110 is configured to execute firmware for driving the storage controller 1100. The central processing unit 1110 may execute various firmware loaded into, for example, a code memory (not shown). In particular, when the program manager 1130 of the present invention is provided as a software module, the central processing unit 1110 may execute the program manager 1130 to perform a program operation of data and various control operations related thereto. According to the execution of the program manager 1130, the central processing unit 1110 may generate various control information necessary for backing up the state group data SGD.

The PLP circuit 1120 monitors an external power supply and detects events such as sudden power-off SPO. When the SPO occurs, the PLP circuit 1120 may generate a power-off detection signal PO_DET and provide it to the program manager 1130.

When the program manager 1130 receives the power-off detection signal PO_DET, the program manager 1130 stops the current program operation. Then, the program manager 1130 enters a backup operation mode and backs up the data stored in the buffer memory 1500 to the nonvolatile memory device 1300. The SPO may occur during pre-programming. Or the SPO may occur before re-programming is performed after the pre-program operation is completed. Then, the program manager 1130 backs up the state group data SGD stored in the buffer memory 1500 to the nonvolatile memory device 1300.

The state group data SGD backed up in the nonvolatile memory device 1300 is in a state to which ECC decoding is applied during a read operation. ECC encoding for backup will be applied to state group data SGD having only message data by ECC decoding. That is, ECC parity of state group data SGD having only message data is generated by the ECC circuit 1160. Then, the encoded state group data SGD is programmed into the nonvolatile memory device 1500. Therefore, during a backup operation, an increase in data size due to ECC parity accompanying the state group data SGD can be minimized.

The host interface 1140 provides an interface between a host and the storage controller 1100. When a SPO event occurs, all communication between the storage device 1000 and the host is cut off. Alternatively, when a SPO event occurs, a clock signal provided to the physical layer PHY of the host interface 1140 may be blocked. The host and the storage controller 1100 may be connected through one of various standardized interfaces. Here, the standard interfaces include ATA (Advanced Technology Attachment), SATA (Serial ATA), e-SATA (external SATA), SCSI (Small Computer Small Interface), SAS (Serial Attached SCSI), PCI (Peripheral Component Interconnection), PCIe (PCI Express), USB (Universal Serial Bus), IEEE 1394, UFS (Universal Flash Storage), and Card interface.

The buffer manager 1150 controls read and write operations of the buffer memory 1500. For example, the buffer manager 1150 temporarily stores write data or read data in the buffer memory 1500 under the control of the CPU 1110 or the program manager 1130. For example, the buffer manager 1150 may temporarily store the read state group data SGD in the buffer memory 1500 when pre-programming is completed. Also, during a re-program operation, the read data and state group data SGD are stored in the buffer memory 1500 and then programmed into the nonvolatile memory device 1300. The buffer manager 1150 receives and processes read or write requests to the buffer memory 1500.

The ECC circuit 1160 performs error correction encoding on data programmed into the nonvolatile memory device 1300. That is, the ECC circuit 1160 encodes programmed data to generate ECC parity. The ECC circuit 1160 performs decoding for error detection and correction on the read data. Error detection or error correction is performed using ECC parity included in the read data. In particular, the ECC circuit 1160 may perform error correction decoding when reading the state group data SGD. To this end, the ECC circuit 1160 uses multi-info indicating the number of multi-bit data used to generate the state group data SGD. In order to decode the state group data SGD, selective inverting is required or desired. That is, when an odd number of pages are used to generate the state group data SGD, inverting for decoding is omitted. On the other hand, when an even number of pages are used when/while generating the state group data SGD, inverting is applied to the read state group data SGD.

The ECC circuit 1160 inverts the read state group data SGD by referring to multi-info, and then performs error correction decoding on the inverted state group data SGD. When decoding is completed, the ECC parity is removed leaving only the state group data SGD message. Then, when inverting is applied again, the read state group data SGD is restored to its original value. In the state group data SGD to be backed up, the parity component that existed at the time of reading does not exist. Accordingly, the state group data SGD to be backed up includes only ECC parity components generated by encoding and is transferred to the nonvolatile memory device 1300. When the SPO occurs, an increase in data size can be minimized when backing up the state group data SGD.

The flash interface 1170 provides interfacing between the storage controller 1100 and the nonvolatile memory device 1300. For example, data processed by the CPU 1110 is stored in the nonvolatile memory device 1300 through the flash interface 1170.

Configurations of the storage controller 1100 exemplarily described above have been described. According to the function of the storage controller 1100 of the present invention, when a SPO event occurs, an increase in the size of the state group data SGD to be backed up can be minimized. Accordingly, limited energy provided by the auxiliary power supply may be efficiently used during SPO.

Figure 3:
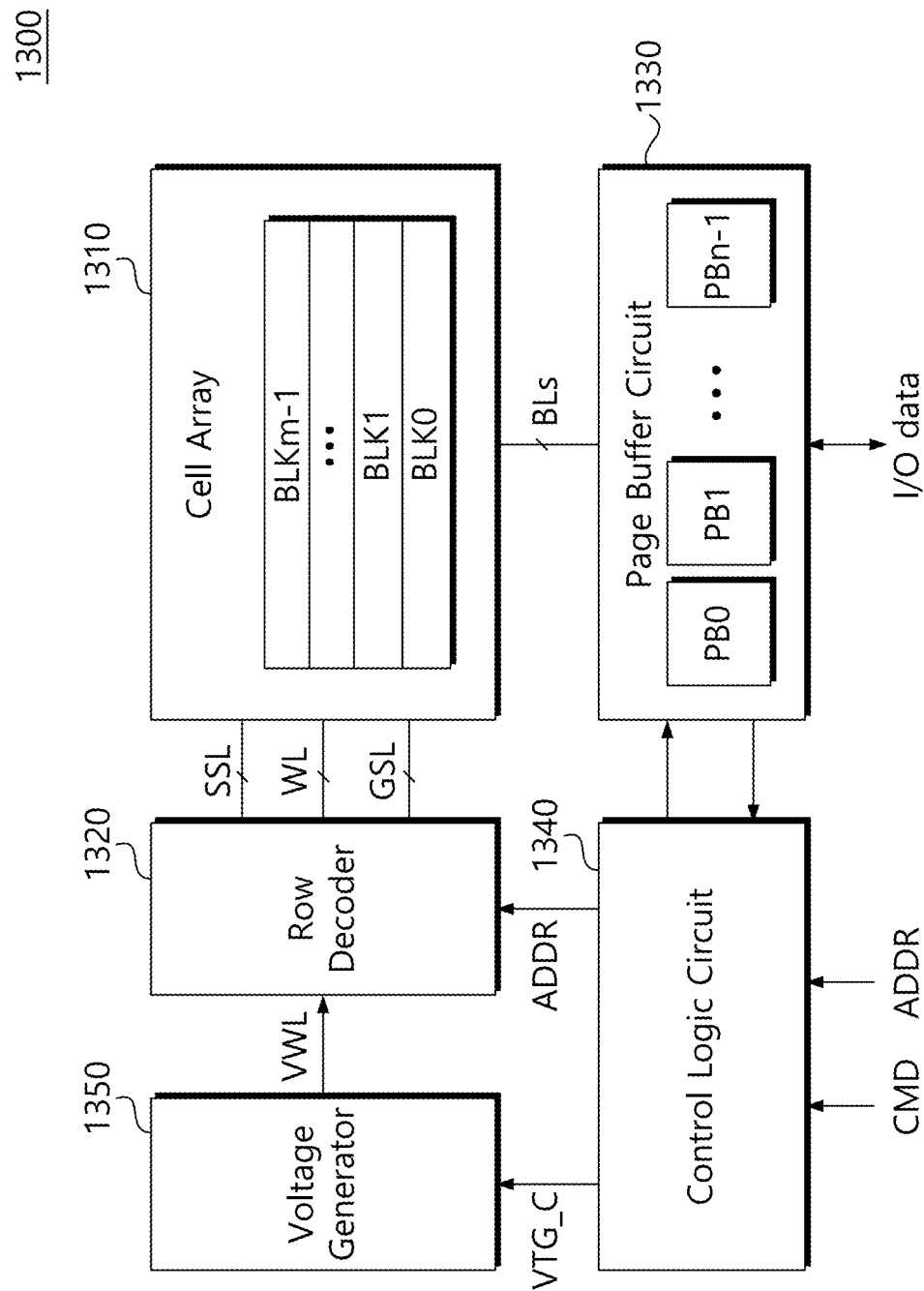
FIG. 3 is an example block diagram of the nonvolatile memory device of FIG. 1.

FIG. 3 is an example block diagram of the nonvolatile memory device of FIG. 1. Referring to FIG. 3, a nonvolatile memory device 1300 may include a cell array 1310, a row decoder 1320, a page buffer circuit 1330, a control logic circuit 1340, and a voltage generator 1350. Although not shown in FIG. 3, the nonvolatile memory device 1300 may further include a data input/output circuit or an input/output interface. In addition, the nonvolatile memory device 1300 may further include components such as a column logic, a pre-decoder, a temperature sensor, a command decoder, and an address decoder.

The cell array 1310 may include a plurality of memory blocks BLK0 to BLKm-1 (m is a positive integer). Each of (or alternatively, at least one of) the plurality of memory blocks BLK0 to BLKm-1 may include a plurality of memory cells. The plurality of memory blocks BLK0 to BLKm-1 may be included in one memory plane, but the present invention is not limited thereto. The cell array 1310 may be connected to the page buffer circuit 1330 through bit lines BL, and may be connected to the row decoder 1320 through word lines WL, string select lines SSL, and ground select lines GSL (GSL0-GSL3).

In an example embodiment, the cell array 1310 may include a 3D memory cell array. Configurations in which the three-dimensional memory array is composed of a plurality of levels, with word lines or bit lines shared between the levels, suitable for the three-dimensional memory array are disclosed in U.S. Pat. Nos. 7,679,133 and 8,553,466, 8,654,587, 8,559,235, and US Patent Publication No. 2011/0233648, which are incorporated herein by reference.

The row decoder 1320 may select one of the memory blocks of the cell array 110 in response to the address ADDR. The row decoder 1320 may select one of the word lines of the selected memory block in response to the address ADDR. The row decoder 1320 transfers the voltage VWL corresponding to the operation mode to the word line of the selected memory block. During a program operation, the row decoder 1320 transmits the program voltage Vpgm and the verify voltage Vfy to the selected word line and the pass voltage Vpass to the unselected word line. During a read operation, the row decoder 1320 transfers the read voltage Vrd to the selected word line and the read pass voltage Vread to the unselected word line.

The page buffer circuit 1330 may include a plurality of page buffers PB0 to PBn-1. The plurality of page buffers PB0 to PBn-1 may be respectively connected to memory cells through a plurality of bit lines BLs. The page buffer circuit 1330 may select at least one bit line from among the bit lines BLs in response to the column address Y-ADDR. The page buffer circuit 1330 may operate as a write driver or a sense amplifier according to an operation mode. For example, during a program operation, the page buffer circuit 1330 may apply a bit line voltage corresponding to data to be programmed to a selected bit line. During a read operation, the page buffer circuit 1330 may detect data stored in a memory cell by sensing a current or voltage of a selected bit line.

The control logic circuit 1340 may generally control various operations within the nonvolatile memory device 1300. The control logic circuit 1340 programs data into the cell array 1310 in response to a control signal CTRL, a command CMD, and/or an address ADDR. The control logic circuit 1340 may output various control signals for reading data from the cell array 1310 or erasing data stored in the cell array 1310. For example, the control logic circuit 1340 may output a voltage control signal VTG_C, an address ADDR, and the like.

In an example embodiment, the control logic circuit 1340 may output control signals for programming multi-bit data according to the received control signal CTRL, command CMD, and/or address ADDR. For example, the control logic circuit 1340 outputs control signals for pre-programming and re-programming, outputs control signals for backing up state group data SGD, or outputs control signals for reading pre-programmed multi-bit data.

The voltage generator 1350 may generate various types of voltages for performing program, read, and erase operations based on the voltage control signal VTG_C. For example, the voltage generator 1350 may generate a program voltage, a read voltage, a program verify voltage, and the like as the word line voltage. For example, the program voltage may be generated in an incremental step pulse program ISPP method. In a program operation for multi-bit data, the voltage generator 1350 may generate a pre-program verification voltage for pre-programming and a re-program verification voltage for re-programming. In this case, the pre-program verification voltage may be lower than the re-program verification voltage.

Figure 4:
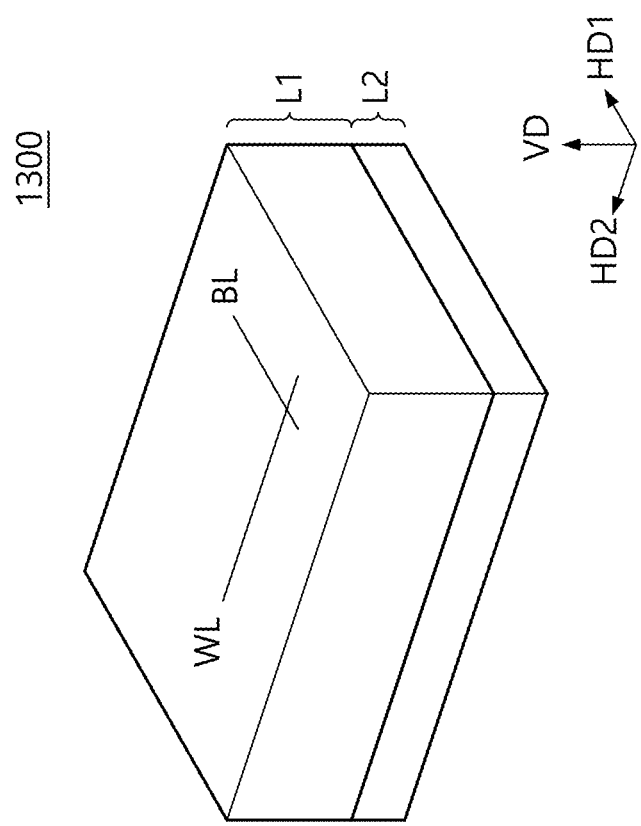
FIG. 4 is a block diagram schematically showing the structure of a nonvolatile memory device according to an example embodiment of the present invention.

FIG. 4 is a block diagram schematically showing the structure of a nonvolatile memory device according to an example embodiment of the present invention. Referring to FIG. 4, the nonvolatile memory device 1300 may include a first semiconductor layer L1 and a second semiconductor layer L2. The first semiconductor layer L1 may be stacked in a vertical direction VD perpendicular (or substantially perpendicular) to the second semiconductor layer L2. Specifically, the second semiconductor layer L2 may be disposed below the first semiconductor layer L1 in a vertical direction VD, and thus, the second semiconductor layer L2 may be disposed close to the substrate.

In an example embodiment, the cell array 1310 of FIG. 3 may be formed on the first semiconductor layer L1. And peripheral circuits corresponding to the row decoder 1320, the page buffer circuit 1330, the control logic circuit 1340, and the voltage generator 1350 of FIG. 3 may be formed on the second semiconductor layer L2. Accordingly, the nonvolatile memory device 1300 may have a structure in which the cell array 1310 is disposed above the peripheral circuits 1320, 1330, 1340, and 1350, that is, a COP (Cell Over Periphery) structure. The COP structure can effectively reduce an area in a horizontal direction and improve the degree of integration of the nonvolatile memory device 1300.

In an example embodiment, the second semiconductor layer L2 may include a substrate (SUB), and peripheral circuits 1320, 1330, 1340 and 1350 may be formed on the substrate by forming transistors and metal patterns for wiring the transistors on the substrate. After the peripheral circuits 1320, 1330, 1340, and 1350 are formed on the second semiconductor layer L2, the first semiconductor layer L1 including the cell array 1310 may be formed. And then metal patterns may be formed to electrically connect the word lines WL and bit lines BL and the peripheral circuits 1320, 1330, 1340, and 1350 formed on the second semiconductor layer L2. For example, bit lines BL may extend in a first horizontal direction HD1, and word lines WL may extend in a second horizontal direction HD2.

Figure 5:
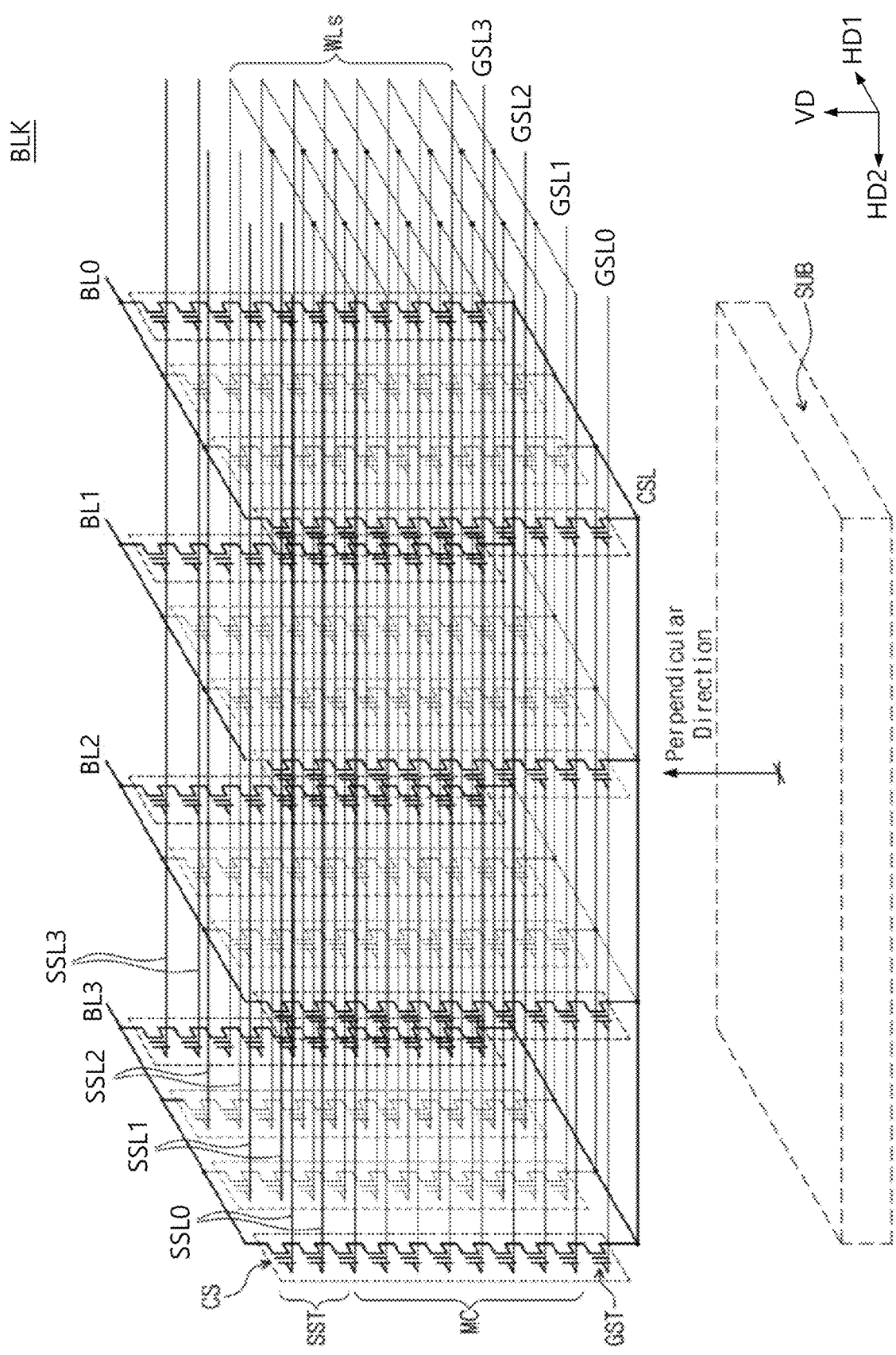
FIG. 5 is a circuit diagram showing an example structure of a memory block constituting the cell array of FIG. 3.

FIG. 5 is a circuit diagram showing an example structure of a memory block constituting the cell array of FIG. 3. Referring to FIG. 5, cell strings CS are formed between the bit lines BL0, BL1, BL2, and BL3 and the common source line CSL to form the memory block BLK.

A plurality of cell strings are formed between the bit line BL0 and the common source line CSL. The string select transistors SST of the cell strings CS are connected to the corresponding bit lines BL. The ground selection transistors GST of the cell strings CS are connected to the common source line CSL. Memory cells MCs are provided between the string select transistor SST and the ground select transistor GST of the cell string CS.

Each of (or alternatively, at least one of) the cell strings CS includes a ground select transistor GST. Ground select transistors included in the cell strings CS may be controlled by the ground select line GSL. Alternatively, although not shown, cell strings corresponding to each row may be controlled by different ground selection lines.

In the above, the circuit structure of memory cells included in one memory block BLK has been briefly described. However, the illustrated circuit structure of the memory block is only a simplified structure for convenience of description, and an actual memory block is not limited to the illustrated example. That is, it will be well understood that one physical block may include more semiconductor layers, bit lines (BLs), and string select lines (SSLs).

Figure 6:
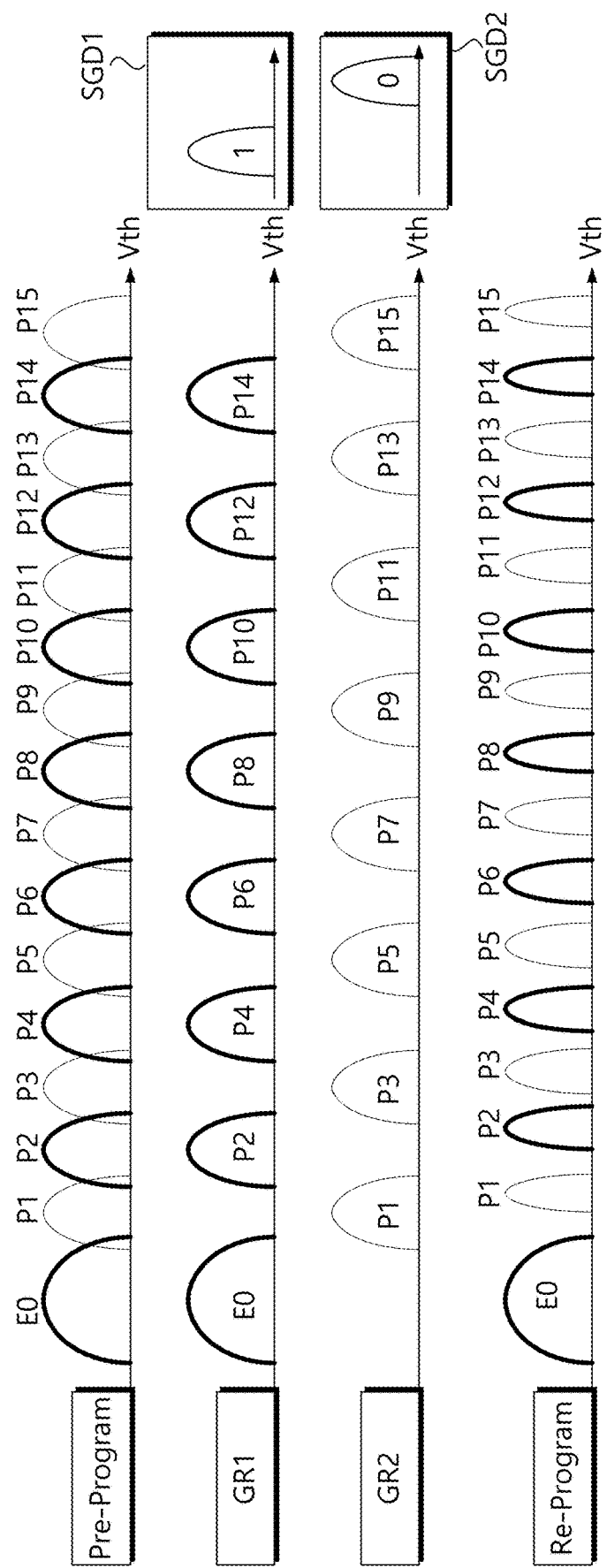
FIG. 6 is a diagram briefly showing data states according to pre-program and re-program according to the present invention.

FIG. 6 is a diagram briefly showing data states according to pre-program and re-program according to the present invention. Referring to FIG. 6, when a program starts, the storage device 1000 may pre-program (or coarse-program) multi-bit data into memory cells of the nonvolatile memory device 1300. For example, when multi-bit data is 4-bit data as shown, a pre-programmed memory cell has a threshold voltage corresponding to any one of 16 threshold voltage states E0, P1 to P15. Each of the 16 threshold voltage states may correspond to 16 values that multi-bit data may have. That is, a pre-programmed memory cell may correspond to one of 16 threshold voltage states according to a multi-bit data value. In this case, threshold voltages of memory cells may vary due to capacitive coupling between adjacent memory cells, and the width of each threshold voltage distribution may be widened by such threshold voltage variation. Accordingly, adjacent threshold voltage distributions may overlap.

Threshold voltage distributions of pre-programmed memory cells may be divided into a plurality of state groups. For example, threshold voltage states corresponding to the erase state E0 and the program states P1 to P15 may be divided into a first state group GR1 and a second state group GR2. In an example embodiment, each of the state groups may include different threshold voltage distributions, and the threshold voltage distributions of each of the state groups may not overlap each other. For example, the first state group GR1 includes an erase state E0, a second program state P2, a fourth program state P4, a sixth program state P6, an eighth program state P8, a tenth program state P10, a twelfth program state P12, and a fourteenth program state P14. The second state group GR2 includes a first program state P1, a third program state P3, a fifth program state P5, a seventh program state P7, a ninth program state P9, a eleventh program state P11, a 13th program state P13, and a 15th program state P15.

Each of the state groups may be indicated by state group data. For example, the first state group GR1 and the second state group GR2 may be represented by 1-bit state group data SGD1. For example, the state group data SGD1 representing the first state group GR1 may be represented as '1', and the state group data SGD2 representing the second state group GR2 may be represented as '0'. However, the present invention is not limited thereto, and the number of bits of state group data may vary according to the number of state groups. For example, when threshold voltage distributions are divided into four state groups, state group data may be 2-bit data. In this case, the number of bits of the state group data may be smaller than the number of bits of the multi-bit data, and when the multi-bit data is N bits, the state group data may be (N-1) bits.

The pre-programmed multi-bit data may correspond to state group data representing one of a plurality of state groups according to data values. For example, the multi-bit data corresponding to the erase state E0 corresponds to the state group data representing the first state group GR1, and the multi-bit data corresponding to the first program state P1 corresponds to the second state group data representing the state group GR2.

When a sudden power-off SPO occurs after pre-programming is completed, the storage device 1000 may back up state group data corresponding to pre-programmed memory cells in the nonvolatile memory device 1300. For example, when multi-bit data corresponding to the first program state P1 is pre-programmed, the storage device 1000 may back up state group data indicating the second state group GR2 corresponding to the pre-programmed memory cells to the nonvolatile memory device 1300.

When power is restored from sudden power-off SPO, the storage device 1000 can restore multi-bit data based on the backed-up state group data. For example, the storage device 1000 may read multi-bit data from pre-programmed memory cells based on state group data. As shown, when a read operation is performed for each state group based on state group data even though there is an overlapping region among threshold voltage distributions of pre-programmed memory cells, to which threshold voltage distribution the overlapping region belongs can be distinguished. Accordingly, reliability of recovered multi-bit data can be improved.

The storage device 1000 may re-program (or fine-program) multi-bit data into the memory cell based on the restored multi-bit data. A program operation for multi-bit data may be completed according to the re-program operation. As shown, a width of a threshold voltage distribution of memory cells may be narrowed by performing a re-programming operation. Since the threshold voltage increase of the memory cell due to re-programming is smaller than the threshold voltage increase due to pre-programming, the threshold voltage distribution due to re-programming may be less affected by coupling. Accordingly, memory cells may have narrow threshold voltage distributions according to the re-programming operation, and an overlapping area of the threshold voltage distributions may be reduced. Accordingly, when multi-bit data is read from the re-programmed memory cell, reliability of the multi-bit data may be improved.

In an example embodiment, the re-program verification voltage for re-programming the multi-bit data may be higher than the pre-program verification voltage for pre-programming the multi-bit data. For example, a pre-program operation is performed using a pre-program verification voltage corresponding to a threshold voltage lower than a desired threshold voltage, and during a re-program operation, a re-program verification voltage higher than the pre-program verification voltage is used. A memory cell can be programmed with a desired threshold voltage. The storage device 1000 may back up state group data after sudden power-off SPO occurs, but the present invention is not limited thereto. For example, the storage device 1000 may back up state group data before sudden power-off SPO occurs.

As described above, the storage device 1000 backs up state group data SGD corresponding to multi-bit data in a sudden power-off SPO event situation. And then, the storage device 1000 may complete a program operation for multi-bit data based on the backed-up state group data. In this case, since the number of bits of the status group data (SGD) is smaller than that of the multi-bit data, auxiliary power and memory capacity required or desired for the backup operation can be reduced compared to the operation of directly backing up the multi-bit data. In particular, in the present invention, when reading the state group data SGD, ECC decoding is performed so that only the message portion can be stored in the buffer memory. Accordingly, an increase in the size of the state group data SGD due to ECC parity occurring during a backup operation can be minimized.

Figure 7:
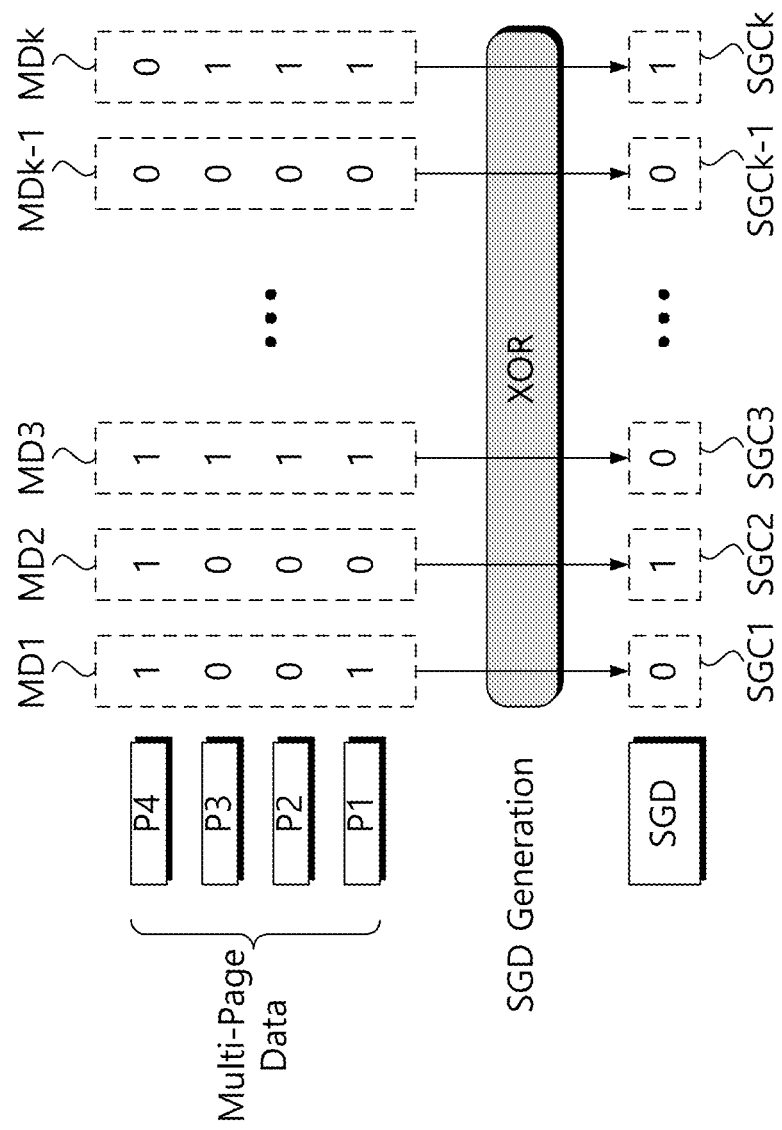
FIG. 7 is a diagram exemplarily illustrating a method of generating state group data SGD according to an example embodiment of the present invention.

FIG. 7 is a diagram exemplarily illustrating a method of generating state group data SGD according to some example embodiments of the present invention. Referring to FIG. 7, the multi-bit data may include first to k-th multi-bit data MD1 to MDk to be programmed into k memory cells connected to one word line. For example, when the multi-bit data is 4-bit data, the multi-page data may include first to fourth page data PD1 to PD4.

The state group data SGD may include state group codes SGC1 to SGCk generated based on the multi-bit data MD1 to MDk. For example, the state group code SGC may be generated based on the number of logic '1' (or '0') among bits of multi-bit data. For example, in the case of multi-bit data MD2 having an odd number of logical '1's, the state group code SGC2 corresponding to '1000' is generated as '1'. In the case of the multi-bit data MD1 having an even number of logical '1's, the state group code SGC corresponding to '1001' may be generated as '0'. That is, each of the state group codes SGC1 to SGCk may be generated through an exclusive OR (XOR) operation of logic bits of each of the corresponding multi-bit data MD1 to MDk.

Bits of each of the generated state group codes SGC1 to SGCk are combined into state group data SGD having a length of one page data. The generated state group data SGD may have fewer bits than multi-page data. For example, when 1-bit state group data is generated from 4-bit multi-data, the bits of the state group code may be reduced to ¼ times those of the multi-page data.

Figure 8A:
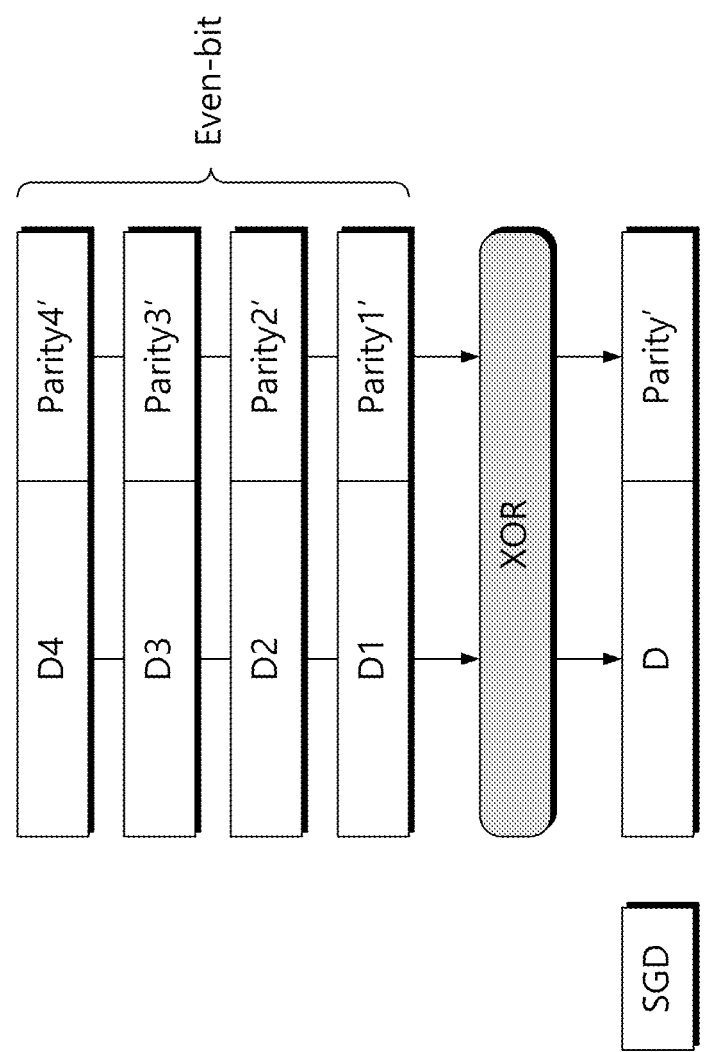
FIG. 8A and FIG. 8B are diagrams each showing the form of multi-bit data of even and odd bits to be programmed and state group data SGD corresponding thereto.
Figure 8B:
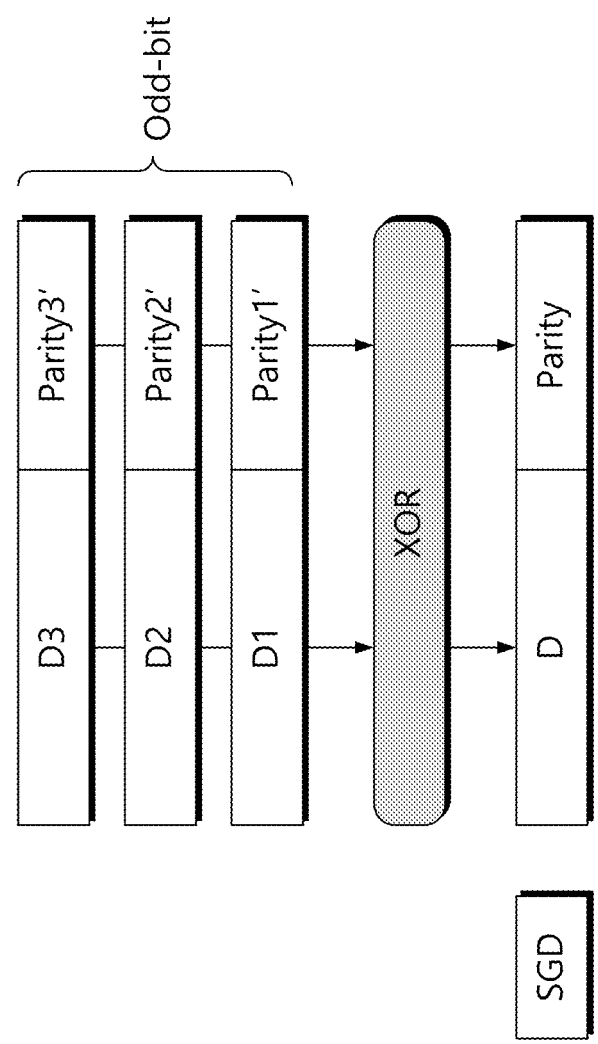

FIG. 8A and FIG. 8B are diagrams each showing the form of multi-bit data of even and odd bits to be programmed and state group data SGD corresponding thereto.

Referring to FIG. 8A, a procedure for generating state group data SGD for multi-bit data (e.g., QLC) consisting of 4-bits is shown. For example, 4-bit multi-bit data per cell programmed in units of one word line (i.e., 4 page data) generates state group data SGD of one page size. That is, when an exclusive OR (XOR) operation is performed on the same columns of each of the four page data, state group data SGDs generated. Each of the four page data is composed of data (D1, D2, D3, D4) and corresponding parities (Parity 1', Parity2', Parity3', Parity4'). Also, the state group data SGD generated from the four page data constitutes a codeword including data (D) and parity (Parity'). For ECC decoding, parity is provided as a non-inverted value.

The state group data SGD generated through an exclusive OR (XOR) operation of four page data is composed of data (D) and inverted parity (Parity'). In the exclusive OR (XOR) operation, the result may vary depending on the number of logic '1's. Accordingly, the parity (Parity') of the state group data SGD generated from multi-bit data of even bits is represented as an inverted parity (Parity'). On the other hand, parity of the state group data SGD generated from multi-bit data of odd bits may be generated as non-inverted parity. In a QLC (Quad Level Cell) memory device, among selected word lines, memory cells in word line units positioned at the edge can be selectively used as SLC (Single Level Cell), MLC (Multi Level Cell), and TLC (Triple Level Cell). In this case, parity of the state group data SGD may be generated as inverted parity or non-inverted parity according to the offset position of the address. To this end, it will be well understood that a separately managed table or control logic may be added. Consequently, the parity is generated as an inverted value or a non-inverted value according to the number of bits of data used to generate the state group data SGD (or the number of XOR operations). In the present invention, ECC decoding may be performed by selectively applying inverting according to the number of bits (or the number of XOR operations) of data used to generate the state group data SGD.

Here, in order to understand the ECC decoding process of the state group data SGD, the following characteristics should be considered. Data (D1+Parity1') to which ECC encoding is applied has an inverted parity (Parity1') in the cell structure of the NAND flash memory. The state group data SGD generated from multi-bit data processed through these ECC encoding includes data (D) and parity (Parity'). This means that the state group data SGD is also generated in the form of a codeword capable of ECC decoding. This is because operators processed by the ECC engine are all based on modular operations, and these modular operations are mostly implemented as exclusive OR (XOR) operation. The state group data SGD is generated through an exclusive OR (XOR) operation. Accordingly, if the problem or challenge of inverting the parity (Parity') of the state group data SGD is solved, the state group data SGD may also be processed through ECC decoding.

The ECC circuit 1160 performs decoding by inverting the received data. This is because data read from the memory cell is ECC-encoded data (e.g., D1+Parity1') and has an inverted parity (Parity1'). For ECC decoding, the parity (Parity1') of the inverted value is inverted again. To this end, inverters are positioned at the input terminal and the output terminal of the ECC circuit 1160, respectively.

The state group data SGD generated through an exclusive OR (XOR) operation is generated in a form capable of ECC decoding. The reason is the characteristics of exclusive OR (XOR) operation and inverting operation. In the exclusive OR (XOR) operation, the result value is determined according to the even/odd number of logical '1's. In addition, since the inverting operation is an operation that simply inverts logic '1' and logic '0', whether or not the inverting operation is present does not affect the result of the exclusive OR (XOR) operation. Therefore, the state group data SGD itself can be regarded as a codeword form to which ECC operation can be applied.

Referring to FIG. 8B, a procedure for generating state group data SGD for multi-bit data (e.g., TLC) consisting of 3-bits is shown. For example, 3-bit multi-bit data (i.e., 3 page data) per cell programmed in units of one word line generates state group data SGD of one page size. That is, when the exclusive OR (XOR) operation is performed on the same columns of each of the three page data, state group data SGD is generated. Each of the three page data is composed of data D1, D2, and D3 and corresponding parities Parity 1', Parity2', and Parity3'. Also, the state group data SGD generated from the three page data constitutes a codeword including data D and parity. Here, the parity of the state group data SGD has a non-inverted value. Therefore, there is no need to perform a separate inverting operation for ECC decoding performed during reading.

Figure 9:
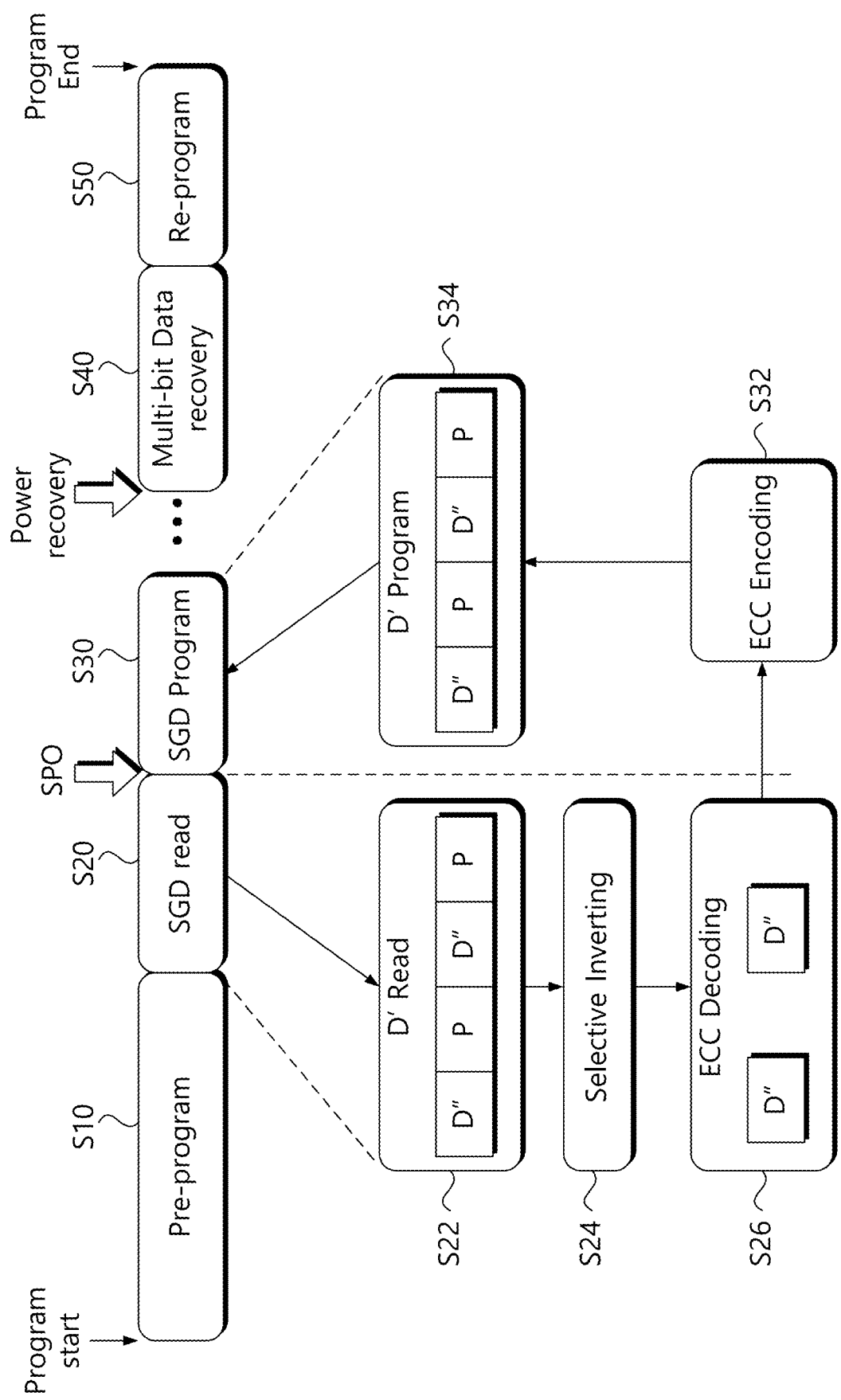
FIG. 9 is a timing diagram briefly illustrating a backup process of state group data SGD upon a sudden power-off SPO event according to an example embodiment of the present invention.

FIG. 9 is a timing diagram briefly illustrating a backup process of state group data SGD upon a sudden power-off SPO event according to some example embodiments of the present invention. Referring to FIG. 9, according to the state group data SGD backup method of the present invention, ECC decoding of the state group data SGD is possible. Through ECC decoding, the state group data SGD may be stored in the buffer memory 1500 in a state in which the ECC parity accompanying the reading is removed. Accordingly, an increase in the size of the state group data SGD that is backed up in the nonvolatile memory device 1300 after ECC decoding can be minimized.

In step S10, pre-programming of multi-bit data is performed. When the multi-bit data is 4-bit data, the pre-programmed memory cell may have a threshold voltage corresponding to any one of 16 threshold voltage states E0, P1 to P15. The state group data SGD is created according to the progress of the pre-program. The state group data SGD may remain stored in a specific latch of the page buffer in which multi-bit data is stored.

In step S20, reading of the state group data SGD is performed. The reading of the state group data SGD includes a reading step of receiving the state group data SGD from the nonvolatile memory device 1300 (step S22), an optional inverting step (step S24), and an ECC decoding step (step S26).

First, in step S22, the state group data (SGD=D') read from the nonvolatile memory device 1300 includes a data part (D") and a parity part (P). At this time, the parity part (P) may be in an inverted state or a non-inverted state according to the number of XOR operations applied when generating the state group data SGD.

In step S24, an inversion operation is performed on the state group data SGD with reference to at least one of the number of XOR operations, the position of word lines, and the number of multi-bit data. If the state group data SGD is generated from odd multi-bit data, the inversion operation will be omitted. On the other hand, if the state group data SGD is generated from an even number of multi-bit data, an inversion operation will be applied.

In step S26, an ECC decoding operation is performed on the state group data SGD. In step S24, the parity part P is restored to a non-inverted state. Therefore, ECC decoding operation using the parity part is possible. Through ECC decoding, an error detection or correction operation may be applied to the data portion (D"). After ECC decoding, the parity portion (P) is no longer necessary. Therefore, in the state group data SGD, the parity portion (P) may be removed, leaving only the pure data part (D"). Only the data portion (D") of the state group data SGD will be stored in the buffer memory 1500.

When a sudden power-off SPO event occurs, the state group data SGD is backed up in step S30. Backup of the state group data SGD may include an ECC encoding step (step S32) and a program step (step S34).

In step S32, ECC encoding is performed on the state group data SGD. The state group data SGD stored in the buffer memory 1500 has parity removed and includes only the data portion (D"). Therefore, ECC encoding will be applied only to the data portion (D") of the state group data SGD. As a result of ECC encoding, ECC parity (P) is generated. Then, the state group data SGD constitutes the ECC codeword. The state group data SGD configured in this way will have the same size as the state group data SGD when read in step S22.

In step S34, the state group data D' composed of the data part D" and the parity part P is backed up in the nonvolatile memory device 1300. The parity read through the ECC decoding in step S26 is removed. Therefore, data size increase due to read parity during ECC encoding can be blocked.

In step S40, when power is restored, multi-bit data may be restored using the backed-up state group data SGD and pre-programmed data. For example, the storage device 1000 may read multi-bit data from pre-programmed memory cells based on the state group data SGD. An overlapping region may exist in threshold voltage distributions of pre-programmed memory cells. However, when a read operation is performed for each state group based on the state group data SGD, it may be identified to which threshold voltage state the overlapping region belongs. Accordingly, the reliability of the restored multi-bit data can be guaranteed.

In step S50, re-programming may be performed based on the recovered multi-bit data. A program operation for multi-bit data may be completed according to the re-program operation. In an example embodiment, the program verifying voltage for re-programming the multi-bit data may be higher than the program verifying voltage for pre-programming the multi-bit data.

Figure 10:
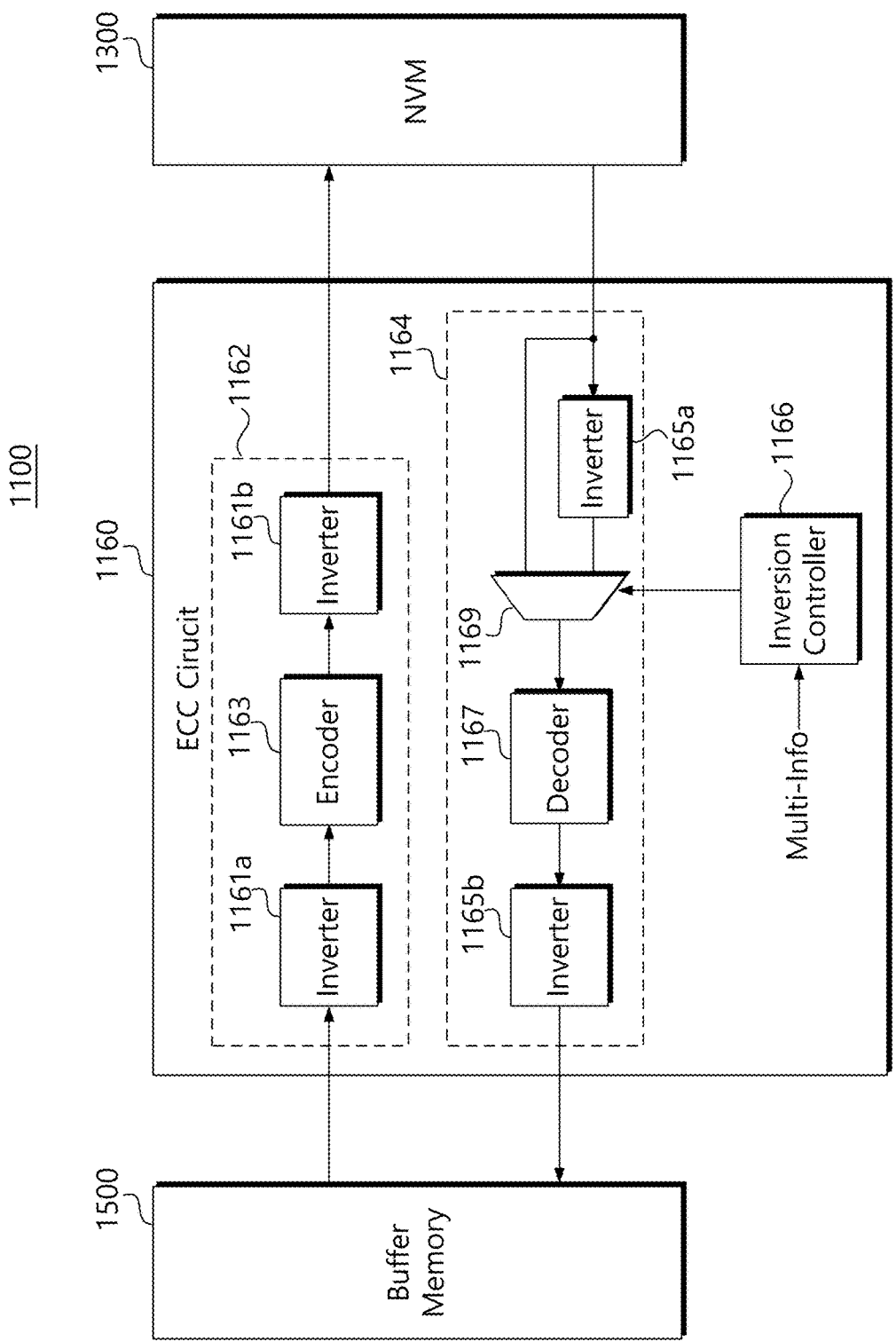
FIG. 10 is a block diagram showing an example structure of an ECC circuit of the present invention.

FIG. 10 is a block diagram showing an example structure of an ECC circuit of the present invention. Referring to FIG. 10, the ECC circuit 1160 of the present invention may include an encoding unit 1162, a decoding unit 1164, and an inversion controller 1166.

The encoding unit 1162 includes a first inverter 1161a, an encoder 1163, and a second inverter 1161b. When data D to be programmed is transmitted from the buffer memory 1500, the data is inverted by the first inverter 1161a. The encoder 1163 generates parity (P) by performing ECC encoding using the inverted data (D'). Then, an ECC codeword (D'+P) is generated by the inverted data (D') and the parity (P). The ECC codeword (D'+P) is re-inverted by the second inverter 1161b and transferred to the nonvolatile memory device 1300 as program data (D+P'). The program procedure of these data is equally applied to the state group data SGD.

The decoding unit 1164 may include a third inverter 1165a, a fourth inverter 1165b, a decoder 1167, and a multiplexer 1169. When reading of the state group data SGD is performed, the state group data SGD read from the nonvolatile memory device 1300 is provided to the decoding unit 1164. At this time, the inversion controller 1166 refers to the multi-info, and the multiplexer 1169 selects an input.

The multi-information Multi-Info may be at least one of the number of XOR operations applied when generating the state group data SGD, the position of a word line, and even/odd number information of multi-bit data. If the state group data SGD is generated from odd multi-bit data, the inversion controller 1166 selects the bypassed input (non-inverted data) rather than the third inverter 1165a (multiplexer 1169). On the other hand, if the state group data SGD is generated from even multi-bit data, the inversion controller 1166 controls the multiplexer 1169 to select an inverted input through the third inverter 1165a. In another example embodiment, the inversion controller 1166 may control the multiplexer 1169 according to the offset position of the address. To this end, the inversion controller 1166 may include a separately managed table or control logic for detecting selection of an edge word line.

The decoder 1167 performs an ECC decoding operation on the state group data SGD. The decoder 1167 may perform an error detection or correction operation on the data portion (D") using the recovered parity portion (P) of the state group data SGD. After ECC decoding, the parity portion (P) is no longer necessary. Therefore, the parity part (P) is removed from the state group data SGD, and only the pure data part (D") is inverted by the fourth inverter 165b and stored in the buffer memory 1500.

Figure 11A:
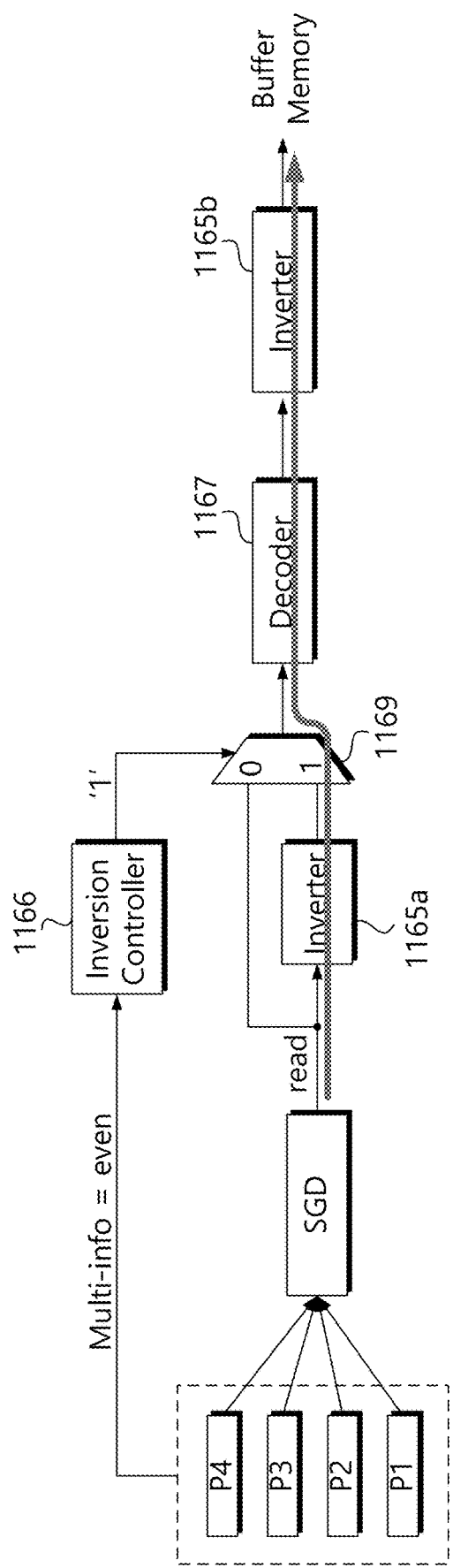
FIG. 11A and FIG. 11B are diagrams briefly illustrating a selective inversion operation of the ECC circuit of FIG. 10 during a read operation of state group data SGD.
Figure 11B:
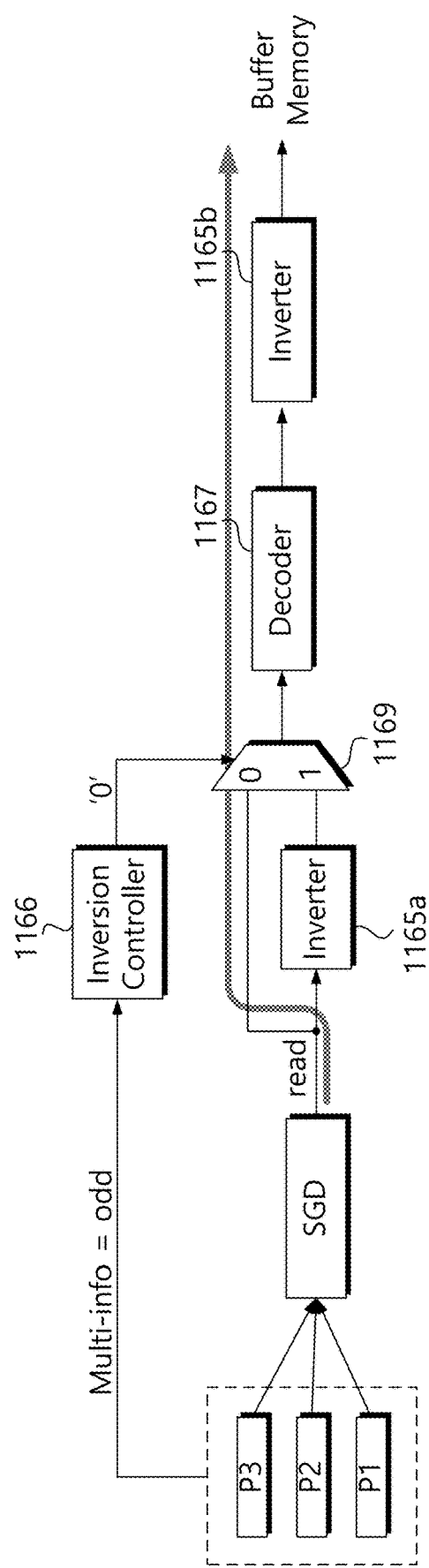

FIG. 11A and FIG. 11B are diagrams briefly illustrating a selective inversion operation of the ECC circuit of FIG. 10 during a read operation of state group data SGD. FIG. 11A shows a data path when the multi-info is an even number, and FIG. 11B shows a data path when the multi-info is an odd number.

Referring to FIG. 11A, it is assumed that the state group data SGD is generated through an exclusive OR (XOR) operation of four pages P1, P2, P3, and P4. Then, Multi-info corresponding to the state group data SGD is provided to the inversion controller 1166 in an even number.

During a read operation on the state group data SGD, the inversion controller 1166 controls the multiplexer 1169 to select the inverted state group data SGD through the third inverter 1165a. Since the inverted state group data SGD includes non-inverted parity P, ECC decoding by the decoder 1167 can be performed. Then, after ECC decoding, the parity part (P) of the state group data SGD is no longer needed. Accordingly, the parity part P may be removed from the state group data SGD, leaving only the pure data part.

Only the data portion of the state group data SGD will be inverted by the fourth inverter 1165b and then stored in the buffer memory 1500.

Referring to FIG. 11B, it is assumed that the state group data SGD is generated through an exclusive OR (XOR) operation of three pages P1, P2, and P3. Then, Multi-info corresponding to the odd number will be provided to the inversion controller 1166.

During a read operation on the state group data SGD, the inversion controller 1166 controls the multiplexer 1169 to select the state group data SGD bypassing the third inverter 1165a. Then, after ECC decoding, the parity part (P) of the state group data SGD is no longer needed. Accordingly, the parity part P may be removed from the state group data SGD, leaving only the pure data part. Only the data portion of the state group data SGD will be inverted by the fourth inverter 1165b and then stored in the buffer memory 1500.

FIG. 12 is a flowchart illustrating a program method utilizing state group data SGD according to an example embodiment of the present invention. Referring to FIG. 12, ECC decoding may be applied when reading state group data SGD. Additional data size increase that may occur during a backup operation for the parity part may be blocked according to ECC decoding of the state group data SGD.

In step S110, pre-programming of multi-bit data is performed. When the multi-bit data is 4-bit data, the pre-programmed memory cell may have a threshold voltage corresponding to any one of 16 threshold voltage states E0, P1 to P15. The state group data SGD is created according to the progress of the pre-program.

In step S120, the state group data SGD from the nonvolatile memory device 1300 is read. The state group data SGD received by the storage controller 1100 may be transferred to the ECC circuit 1160 after applying the inversion method described above. For example, the parity part of the state group data SGD read from the nonvolatile memory device 1300 may be in an inverted state or in a non-inverted state according to the number of XOR operations applied when generating the state group data SGD. If the state group data SGD is generated from odd multi-bit data, the inversion operation will be omitted. On the other hand, if the state group data SGD is generated from an even number of multi-bit data, the inversion operation will be applied.

In step S130, an ECC decoding operation is performed on the state group data SGD. The parity part (P) of the state group data SGD is restored to a non-inverted state by the selective inversion operation. Therefore, ECC decoding operation using the parity part is possible. Through ECC decoding, an error detection or correction operation may be applied to the data portion of the state group data SGD. After ECC decoding, the parity part of the state group data SGD may be removed and only the pure data part may remain. The data part of the state group data SGD will be stored in the buffer memory 1500. Through ECC decoding, the parity part of the state group data SGD read from the nonvolatile memory device 1300 is removed. Accordingly, in the case of being backed up in the nonvolatile memory device 1300, only the data portion of the state group data SGD is applied to ECC encoding. Therefore, data size increase by the parity part of the read state group data SGD can be blocked.

In step S140, a sudden power-off SPO event is detected. If a sudden power-off SPO event is detected ('Yes' direction), the procedure moves to step S150. On the other hand, if a sudden power-off SPO event is not detected ('No' direction), the procedure moves to step S170.

In step S150, the storage controller 1100 performs a dump or backup of the state group data SGD stored in the buffer memory 1500. Backup of the state group data SGD may include ECC encoding and programming into the nonvolatile memory device 1300.

In step S160, when power is restored, multi-bit data may be restored using the backed-up state group data SGD and pre-programmed data. For example, the storage device 1000 may read multi-bit data from pre-programmed memory cells based on the state group data SGD. An overlapping region may exist in threshold voltage distributions of pre-programmed memory cells. However, when a read operation is performed for each state group based on the state group data SGD, it may be identified to which threshold voltage state the overlapping region belongs. Accordingly, the reliability of the restored multi-bit data can be guaranteed.

In step S170, re-programming may be performed based on the recovered multi-bit data. A program operation for multi-bit data may be completed according to the re-program operation. In an example embodiment, the program verifying voltage for re-programming the multi-bit data may be higher than the program verifying voltage for pre-programming the multi-bit data.

As described above, according to the program method of the present invention, ECC decoding of state group data SGD is possible. Accordingly, the increase in data size due to a parity part occurring when ECC decoding is impossible during a backup operation of the state group data SGD can be minimized.

Figure 13:
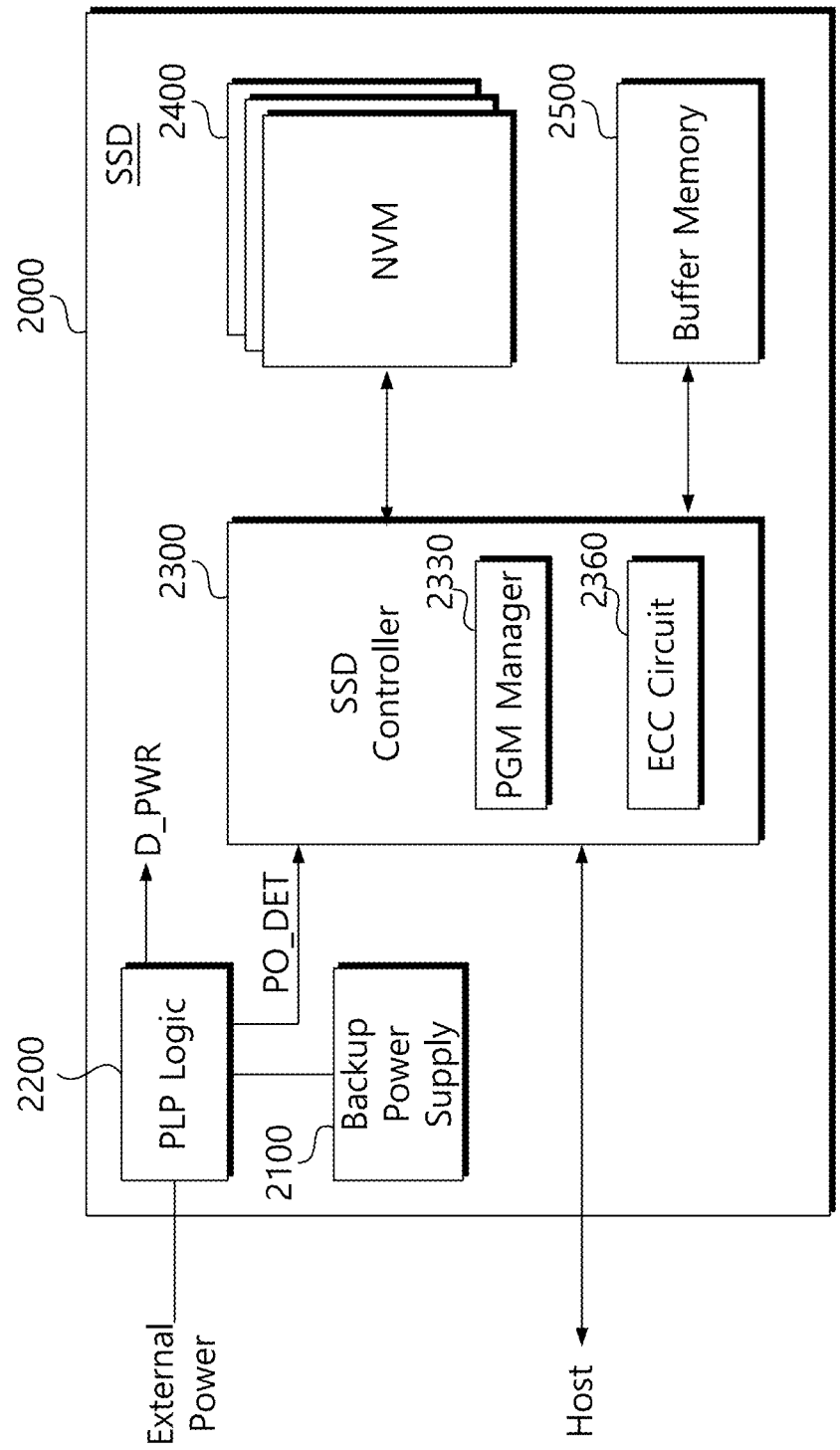
FIG. 13 is a block diagram showing a solid state drive SSD according to another example embodiment of the present invention.

FIG. 13 is a block diagram showing a solid state drive SSD according to another example embodiment of the present invention. Referring to FIG. 13, the solid state drive 2000 includes an auxiliary power supply 2100, a power loss prevention logic 2200, an SSD controller 2300, a nonvolatile memory device 2400, and a buffer memory 2500.

The auxiliary power supply 2100 supplies stored energy to the solid state drive 2000 when a power-off event in which external power is cut off occurs. The solid state drive 2000 will complete the current operation using energy from the auxiliary power supply 2100 and perform a data backup operation. Therefore, the reliability of the backup operation can be increased by using the limited energy accumulated in the auxiliary power supply 2100 efficiently.

The power loss prevention logic 2200 is a component for preventing or reducing loss of power supplied to the solid state drive 2000. The power loss prevention logic 2200 may be formed as an integrated circuit (IC), chip, or device. In a situation where external power is normally supplied, the power loss prevention logic 2200 provides external power as device power D_PWR used by the solid state drive 2000. On the other hand, the power loss prevention logic 2200 provides the output of the auxiliary power supply 2100 as the device power supply D_PWR used by the solid state drive 2000 when external power is cut off.

In addition, the power loss prevention logic 2200 may detect a power off event (PO Event) such as an external power cut off or a serious voltage drop. When a sudden power-off SPO event is detected, the power loss prevention logic 2200 may provide a power off detection signal PO_DET to the storage controller 2300. Also, the power loss prevention logic 2200 may switch the source of the device power supply D_PWR for driving the solid state drive 2000 from external power to the auxiliary power supply 2100.

The SSD controller 2300 may be configured to control the nonvolatile memory device 2400 and the buffer memory 2500 according to a command or control from a host. For example, the SSD controller 2300 may write data to the nonvolatile memory device 2400 or read data stored in the nonvolatile memory device 2400 according to a request of a host. To access the nonvolatile memory device 2400, the SSD controller 2300 may provide commands, addresses, data, and control signals to the nonvolatile memory device 2400.

In particular, the SSD controller 2300 may perform ECC decoding during a read operation of the state group data SGD. After ECC decoding, the ECC parity included in the state group data SGD may be removed. Accordingly, when the state group data SGD is backed up, capacity increase due to ECC parity can be prevented or reduced. If ECC parity is not removed through ECC decoding of the state group data SGD, data encoded with the ECC parity will be added when the state group data SGD is backed up.

For a backup operation of the state group data SGD according to some example embodiments of the present invention, the SSD controller 2300 may include a program manager 2330 and an ECC circuit 2360. When receiving the power off detection signal PO_DET, the program manager 2330 stops the operation currently being performed. Then, the program manager 2330 enters a backup operation mode and backs up data stored in the buffer memory 2500 to the nonvolatile memory device 2400. At this time, when pre-programming is in progress or the pre-program operation is completed and sudden power-off (SPO) occurs before re-programming, the program manager 2330 backs up the state group data SGD stored in the buffer memory 2500 to the nonvolatile memory device 2400. At this time, the state group data SGD to be backed up is backup data to which ECC decoding is applied during a read operation. In addition, the program manager 2330 generates ECC parity by applying ECC encoding to the state group data SGD having only message data, and programs it in the nonvolatile memory device 2400. Accordingly, an increase in the size of parity data accompanying reading of the state group data SGD can be minimized.

The nonvolatile memory device 2400 and the buffer memory 2500 are substantially the same as those of FIG. 1 described above. Therefore, a description of these will be omitted.

Any of the elements and/or functional blocks disclosed above may include or be implemented in processing circuitry such as hardware including logic circuits; a hardware/software combination such as a processor executing software; or a combination thereof. For example, the program manager 1130, buffer manager 1150, control logic circuit 1340, inversion controller 1166, and SSD controller 230 may be implemented as processing circuitry. The processing circuitry specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

The above are specific example embodiments for carrying out the present invention. In addition to the above-described example embodiments, the present invention may include simple design changes or easily changeable example embodiments. In addition, the present invention will include techniques that can be easily modified and implemented using the example embodiments. Therefore, the scope of the present invention should not be limited to the above-described example embodiments, and should be defined by the claims and equivalents of the claims of the present invention as well as the claims to be described later.

What is claimed is:

1. A method for programming a storage device including a nonvolatile memory device and a storage controller for storing multi-bit data:
    programming, by the storage controller, the multi-bit data into the nonvolatile memory device based on a pre-programming operation;
    reading state group data of the multi-bit data generated in the nonvolatile memory device based on a program result of the pre-programming operation, the state group data including a data portion and a parity portion;
    performing, by the storage controller, error correction decoding on the state group data, wherein the error correction decoding is performed based at least in part on the parity portion; and
    removing the parity portion of the state group data after performing the error correction decoding.

2. The method of claim 1, further comprising:
    selectively inverting the state group data read based on multi-information.

3. The method of claim 2, wherein the multi-information includes at least one of a number of bits of the multi-bit data, location information of a word line from which the multi-bit data being read, and a number of XOR operations used while generating the state group data.

4. The method of claim 3, wherein in the selectively inverting, in response to a number of bits of the multi-bit data being even, the storage controller is configured to invert the read state group data, and in response to the number of bits of the multi-bit data being odd, the storage controller is configured to not invert the read state group data.

5. The method of claim 1, further comprising:
    backing up the state group data processed by the error correction decoding in the nonvolatile memory device in response to a sudden power-off event being detected.

6. The method of claim 5, further comprising:
    reading the multi-bit data based on the backed-up state group data in response to power being restored after the sudden power-off event; and
    re-programming the read multi-bit data into the nonvolatile memory device.

7. The method of claim 6, wherein a re-program verification voltage applied to any one program state in the re-programming is higher than a pre-program verification voltage applied to any one program state.

8. A storage device, comprising:
    a nonvolatile memory device provided as a storage medium of the storage device;
    a buffer memory configured to temporarily store data input/output to the nonvolatile memory device; and
    a storage controller configured to perform a pre-program operation to program multi-bit data requested to be written into a first area of the nonvolatile memory device, and perform a re-program operation to program the multi-bit data into a second area of the nonvolatile memory device using a state group data generated through the pre-program operation, wherein the state group data includes a data portion and a parity portion, the storage controller is further configured to perform error correction decoding in response to reading the state group data and remove the parity portion of the state group data after performing the error correction decoding, and the error correction decoding is performed based at least in part on the parity portion.

9. The storage device of claim 8, wherein the storage controller comprises,
a power loss prevention circuit configured to detect a sudden power-off event;
a program manager configured to perform the pre-program operation and the re-program operation on the multi-bit data; and
an error correction code circuit configured to perform an error correction operation on the multi-bit data and the state group data,
wherein the error correction code circuit configured to perform a selective inversion operation on the read state group data.

10. The storage device of claim 9, wherein the error correction code circuit comprises,
a first inverter configured to invert the state group data;
a multiplexer configured to select one of a non-inverted state group data and the state group data inverted by the first inverter based on multi-information;
a decoder configured to perform error correction decoding on the inverted or non-inverted state group data output from the multiplexer;
a second inverter configured to invert a data portion of the decoded inverted or non-inverted state group data and providing the decoded inverted or non-inverted state group data having the inverted data portion to the buffer memory; and
an inversion controller configured to control the multiplexer based on the multi-information.

11. The storage device of claim 10, wherein the inversion controller includes a control logic or table configured to control the multiplexer based on a position of a word line from which the multi-bit data is read.

12. The storage device of claim 10, wherein the inversion controller is configured to control the multiplexer to select an output of the first inverter in response to a number of bits of the multi-bit data being even, and to select the non-inverted state group data in response to the number of bits of the multi-bit data being odd.

13. The storage device of claim 10, wherein the storage controller is configured to perform an error correction encoding operation on the data portion of the state group data and back up the data portion of the state group data to the nonvolatile memory device in response to the sudden power-off event occurring.

14. A programming method of a storage device storing multi-bit data based on a pre-program operation and a re-program operation:
programming the multi-bit data into a nonvolatile memory device based on the pre-program operation;
reading state group data of the multi-bit data generated based on the pre-program operation, wherein the state group data includes a data portion and a parity portion;
performing error correction decoding on the state group data, and wherein the error correction decoding is performed based at least in part on the parity portion; and
backing up the state group data processed by the error correction decoding after processing an error correction encoding in the nonvolatile memory device, in response to sudden power-off being detected,
wherein the parity portion is removed from the state group data processed by the error correction decoding.

15. The method of claim 14, wherein the reading the state group data includes selectively inverting the state group data.

16. The method of claim 15, wherein in the selectively inverting includes, determining whether to invert the state group data by referring to at least one of a number of bits of the multi-bit data, position information of a word line from which the multi-bit data was read, and a number of times of exclusive OR (XOR) operations used when generating the state group data.

17. The method of claim 16, wherein, in response to the number of bits of the multi-bit data being an even number, the read state group data is inverted, and in response to the number of bits of the multi-bit data being an odd number, the state group data is non-inverted.

* * * * *